United States Patent
Brussog

(10) Patent No.: US 6,270,236 B1
(45) Date of Patent: Aug. 7, 2001

(54) L.E.D LIGHTING UNIT WITH TRANSPARENT CARRIER PANEL

(75) Inventor: Ingo Brussog, Sachsenheim (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/449,323

(22) Filed: Nov. 24, 1999

(30) Foreign Application Priority Data

Nov. 27, 1998 (DE) .............................................. 198 54 899

(51) Int. Cl.⁷ ...................................................... F21V 21/00
(52) U.S. Cl. ........................ 362/249; 362/311; 362/227; 362/555; 428/901
(58) Field of Search ...................................... 362/800, 487, 362/540, 541, 543, 544, 545, 249, 23, 28, 29, 587, 555, 559, 227, 311; 428/901

(56) References Cited

U.S. PATENT DOCUMENTS 5,367,441 * 11/1994 Wustlich ................................. 362/97
6,106,127 * 8/2000 Fuwausa ................................. 362/29

FOREIGN PATENT DOCUMENTS 196 35 564    3/1997 (DE) .

OTHER PUBLICATIONS

Patent Abstracts of Japan, JP5119706, Stanley Electric Co. Ltd. Described in the Specification.
Patent Abstracts of Japan, JP4199754, Stanley Electric Co. Ltd. Described in the Specification.
Stanley Electric Sales of America, Inc. http://www.stanleyelec.com/smt/rm.htm, Nov. 17, 1998. Described in the Specification.

* cited by examiner

Primary Examiner—Thomas M. Sember
Assistant Examiner—Ismael Negron
(74) Attorney, Agent, or Firm—Kenyon & Kenyon

(57) ABSTRACT

A lighting unit includes a transparent carrier panel provided with electrically conductive structures, in particular a structured ITO layer on one side. Surface mount LEDs having terminals on both sides of a light emitting side are mounted on the carrier panel in such a way that the terminals are in contact with the conductive structures. The light emitting side faces the carrier panel.

8 Claims, 1 Drawing Sheet

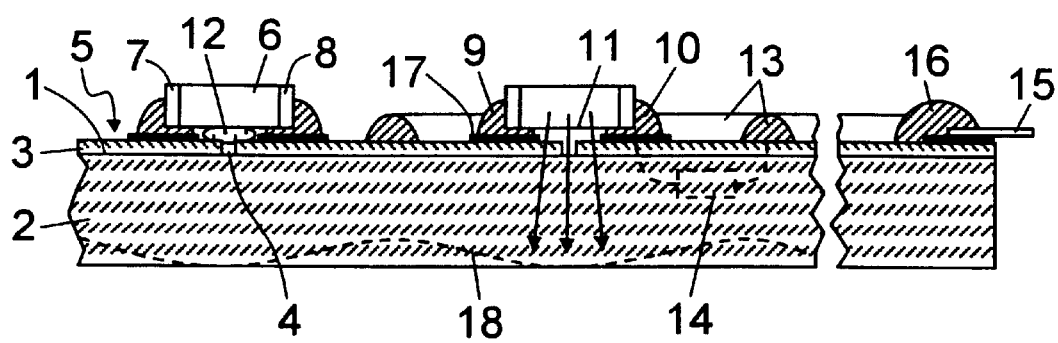

L.E.D LIGHTING UNIT WITH TRANSPARENT CARRIER PANEL

BACKGROUND INFORMATION

In lighting units with LEDs, e.g., additional brake lights for motor vehicles, the LEDs are usually mounted on a circuit board together with appropriate current limiting resistors. To protect the LEDs and optionally to improve the light distribution, a protective lens (a glass panel in the simplest case) is placed in front of it. German Pat. No. 196 35 564 describes that resistors may be designed as wired components, surface mount devices (SMD) or in the form of a resistance layer on the circuit board.

Japanese Pat. No. 5119706 describes a lighting unit where LED chips are mounted on a glass panel. To this end, the glass panel is coated on one side with a layer of indium-tin oxide (ITO) structured in a photolithographic process. First contact areas are applied in the form of a gold layer at the points where the LED chips are to be placed, and second contact areas also in the form of a gold layer are applied at adjacent locations, and the LED chips are attached to the first contact areas by die bonding with the help of electrically conducting adhesive and are bonded to the second contact areas by wire bonding. Due to the structure and mounting of the LED chips, they emit light in the direction away from the glass panel holding them.

Japanese Pat. No. 4199754 describes a similar lighting unit which differs from the conventional lighting unit described above in that a nickel-phosphorus layer is applied to the structured ITO layer and then a gold layer is applied to this, with the LED chips being attached to the gold layer over the first and second contact areas by die bonding and wire bonding. The nickel-phosphorus layer assumes the function of current limiting resistors for the individual LEDs. Here again, due to the structure and mounting of the LED chips, they emit light in the direction away from the glass panel holding them.

Surface mount (SMD) LEDs which, when assembled on a circuit board, have their light emitting side facing the circuit board, with the light passing through a hole in the circuit board, are described by Stanley Electric Sales of America, Inc. (online Internet address: URL: http://www.stanleyelec.com/smt/rm.htm (as of Nov. 17, 1998). Similar LEDs are also distributed by Siemens AG under the name "Hyper TOPLED® RG."

SUMMARY

An object of the present invention is to reduce the manufacturing and design complexity of lighting units having LEDs, in particular with regard to different shapes and dimensions of lighting units.

According to the present invention, this object is achieved by providing a lighting unit having a transparent carrier panel provided with electrically conductive structures on one side, and surface mount LEDs having terminals on both sides of a light emitting side that are mounted on the carrier panel with their terminals in contact with the conductive structures and with the light emitting side facing the carrier panel.

The LEDs may be, for example, the above-mentioned LEDs from Siemens or Stanley Electric. The transparent carrier panel assumes the function of a protective lens as well as the supporting function for the LEDs, with the conductive structures on the carrier panel establishing the electric connections to the LEDs. According to the respective design of the conductive structures, the LEDs may be controlled individually or in groups connected in parallel or in series. Since the LEDs are surface mount devices, the carrier panel may be assembled with the LEDs by the simplest method, regardless of its respective size and shape, with the different areas of the carrier panel being assembled with different LEDs, e.g., of different colors. In this way, additional brake lights, rear lights and flashing lights for vehicles, either individually or both integrated into one lighting unit, interior lights for vehicles, trunk lights, glove compartment lights, traffic lights, lights for advertising purposes or display lights in various sizes and shapes can be manufactured at a minimal manufacturing expense. In addition, the lighting unit according to the present invention is characterized by an especially small overall height. The transparent carrier panel itself may additionally be provided with imprints, e.g., for marking display fields or advertising imprints, and there are no adjustment problems with regard to the position of the LEDs and the imprints due to the design of the lighting unit according to the present invention.

The transparent carrier panel may be a glass or plastic panel, which may be more or less transparent and may be colored, depending on the application, and may be designed as reinforced glass or laminated safety glass for high mechanical stresses. The carrier panel may also have optical structures such as grooves, grids or lenses for light scattering or light bundling on the side facing away from the mounting side.

The conductive structures on the carrier panel allow the light emitted by the LEDs to pass through the carrier panel, which is accomplished either by the fact that the carrier panel remains uncovered by the conductive structures in the areas directly opposite the light emitting sides of the LEDs, or by the fact that the conductive structures themselves are transparent. In the latter case, the conductive structures preferably include an indium-tin oxide (ITO) layer which is structured either at the time when the carrier panel is applied or by subsequent removal of material, in the latter case in an especially simple manner by introducing separation grooves by using a laser. As an alternative, the conductive structures may be made of a conductive plastic or they may be formed by metallization or by applying conductive pastes, e.g., by printing.

The LEDs may be attached to the conductive structures with a conductive adhesive at their terminal points, so that additional electrically conductive contact areas may be applied to these structures at the respective locations by coating or by applying a conductive paste.

To increase their mechanical stability, the LEDs may be attached to the carrier panel by a transparent adhesive on their light emitting side.

The electrically conductive structures are preferably made of a resistor material, e.g., in the case of the ITO layer, to which are additionally applied electrically conductive current leads, e.g., by screen printing, with the resistor material between the current leads and the terminals of the LEDs forming current limiting resistors for the LEDs.

BRIEF DESCRIPTION OF THE DRAWING

The FIGURE shows a cross-sectional view of one embodiment of the lighting unit according to the present invention.

DETAILED DESCRIPTION

As shown in the FIGURE, a transparent indium-tin oxide (ITO) layer 3 is applied to one side 1 of a carrier panel 2 which is also transparent, for example, a glass panel. This layer is structured by using a laser to create separation grooves 4. Surface mount LEDs 6 are mounted on conductive structures 5 formed by ITO layer 3 with separation grooves 4 and are connected both electrically and mechanically to conductive structures 5 by a conductive adhesive 9, 10 at their terminals 7, 8, facing carrier panel 2 with their light emitting side 11. On their light emitting sides 11, LEDs 6 may also be attached by a transparent adhesive 12 to carrier panel 2 as needed. In addition, electrically conductive current leads 13 of a conductive paste are also applied to ITO layer 3, with ITO layer 3 forming current limiting resistors 14 for LEDs 6 between these leads and terminals 7, 8 of LEDs 6. Contacting the lighting unit with an external power supply (not shown here) may be accomplished either by way of surface mount plug connectors (not shown here) which are connected to conductive structures 5 in the same way as LEDs 6 or, as in the embodiment illustrated here, by a flat conductor 15 in a standard design or as a product-specific flexible circuit board connected to conductive structures 5 by a conductive adhesive 16 in the edge area of transparent carrier panel 2.

To increase contact stability, conductive structures 5 may have additional electrically conductive contact areas 17, e.g., in the form of a metal coating in the areas of the contact with terminals 7, 8 of the LEDs. To be able to scatter or bundle, as needed, the light passing through ITO layer 3 and carrier panel 2 from LEDs 6, transparent panel 2 may be provided with an optical structure 18, e.g., grooves, on its side facing away from LEDs 6.

What is claimed is:

1. A lighting unit, comprising:

a transparent carrier panel;

electrically conductive structures provided on a first side of the carrier panel;

surface mounted light emitting diodes (LEDs), each having a light emitting side and including terminals on two opposite ends of the light emitting diode, the LEDs being mounted on the carrier panel so that the terminals of the surface mounted LEDs are in contact with the conductive structures, the light emitting side of each of the LEDs facing the carrier panel.

2. The lighting unit according to claim 1, wherein the carrier panel includes optical structures on a side facing away from the LEDs, the optical structures for one of scattering and bundling light.

3. The lighting unit according to claim 1, wherein the conductive structures are made of a structured indium-tin oxide (ITO) layer.

4. The lighting unit according to claim 3, wherein the ITO layer is structured by creating separation grooves using a laser.

5. The lighting unit according to claim 1, wherein the terminals of the LEDs are connected to the conductive structures on the carrier panel via a conductive adhesive.

6. The lighting unit according to claim 1, further comprising:

additional electrically conducting contact areas applied to the conductive structures in areas of contact with the terminals of the LEDs.

7. The lighting unit according to claim 1, wherein the light emitting side of each of the LEDs is attached to the carrier panel by a transparent adhesive.

8. The lighting unit according to claim 1, wherein the electrically conductive structures are made of a resistor material, electrically conductive current leads being applied to the resistor material, the resistor material forming current limiting resistors for the LEDs between the current leads and the terminals of the LEDs.

* * * * *